(12) United States Patent
Kim et al.

(10) Patent No.: US 10,609,262 B2
(45) Date of Patent: Mar. 31, 2020

(54) LENS BARREL AND CAMERA MODULE COMPRISING SAME

(71) Applicant: LG INNOTEK CO., LTD., Seoul (KR)

(72) Inventors: Dae Hwan Kim, Seoul (KR); Seung Ryong Park, Seoul (KR); Jung Hoo Seo, Seoul (KR); Sang Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/579,059

(22) PCT Filed: Jun. 3, 2016

(86) PCT No.: PCT/KR2016/005879
§ 371 (c)(1),
(2) Date: Dec. 1, 2017

(87) PCT Pub. No.: WO2016/195403
PCT Pub. Date: Dec. 8, 2016

(65) Prior Publication Data
US 2018/0176431 A1    Jun. 21, 2018

(30) Foreign Application Priority Data

Jun. 3, 2015 (KR) .................. 10-2015-0078601
Oct. 7, 2015 (KR) .................. 10-2015-0140713

(51) Int. Cl.
*H04N 5/225* (2006.01)
*G02B 27/00* (2006.01)
(Continued)

(52) U.S. Cl.
CPC ............. *H04N 5/2254* (2013.01); *G02B 7/02* (2013.01); *G02B 7/021* (2013.01); *G02B 7/026* (2013.01);
(Continued)

(58) Field of Classification Search
CPC .. H04N 5/2254; G02B 27/0006; G02B 7/021; G02B 7/026; G02B 7/028; G02B 7/02;
(Continued)

(56) References Cited

U.S. PATENT DOCUMENTS 5,907,725 A    5/1999 Nomura et al.
2003/0155001 A1    8/2003 Hoetzer et al.
(Continued)

FOREIGN PATENT DOCUMENTS

CN    105007799 A    10/2015
JP    2003-209723 A    7/2003
(Continued)

*Primary Examiner* — Lin Ye
*Assistant Examiner* — John H Morehead, III
(74) *Attorney, Agent, or Firm* — Birch, Stewart, Kolasch & Birch, LLP

(57) ABSTRACT

One embodiment of a camera module may comprise: a lens barrel having a hollow formed therein, comprising at least one lens aligned in the optical axis of the hollow; a holder having formed therein an internal space in which a part of the lens barrel is accommodated; a casing coupled to the holder and having formed therein an internal space in which a printed circuit board is accommodated; and a first heater which is electrically connected to the printed circuit board to heat the lens.

19 Claims, 12 Drawing Sheets

(51) Int. Cl.
  *G02B 7/02* (2006.01)
  *H05B 3/84* (2006.01)
  *H05B 3/02* (2006.01)
  *H05K 1/02* (2006.01)

(52) U.S. Cl.
  CPC ......... *G02B 7/028* (2013.01); *G02B 27/0006* (2013.01); *H05B 3/02* (2013.01); *H05B 3/84* (2013.01); *H05K 1/0201* (2013.01); *H05B 2203/013* (2013.01)

(58) Field of Classification Search
  CPC ... H05B 3/40; H05B 3/02; H05B 3/14; H05B 3/34; H05B 1/02; H05K 1/0201
  See application file for complete search history.

(56) References Cited

U.S. PATENT DOCUMENTS

| | | | | |
|---|---|---|---|---|
| 2004/0223074 A1* | 11/2004 | Takada | ............ | G02B 7/026 348/360 |
| 2007/0058070 A1* | 3/2007 | Chen | ............ | H04N 5/2254 348/340 |
| 2008/0100933 A1* | 5/2008 | Yuan | ............ | G02B 7/028 359/820 |
| 2008/0239453 A1 | 10/2008 | Finot et al. | | |
| 2011/0199530 A1* | 8/2011 | Kosaka | ............ | G02B 7/02 348/340 |
| 2011/0249120 A1* | 10/2011 | Bingle | ............ | B60R 11/04 348/148 |
| 2012/0170119 A1* | 7/2012 | Chu | ............ | G03B 17/55 359/512 |
| 2012/0212806 A1* | 8/2012 | Shibata | ............ | H04N 5/23212 359/356 |
| 2013/0038783 A1* | 2/2013 | Shimizu | ............ | H04N 5/2254 348/360 |
| 2013/0271641 A1* | 10/2013 | Calvet | ............ | G02B 7/028 348/340 |

FOREIGN PATENT DOCUMENTS

| | | |
|---|---|---|
| JP | 2008-160777 A | 7/2008 |
| KR | 10-0367787 B1 | 1/2003 |
| KR | 10-2007-0018642 A | 2/2007 |
| KR | 10-2011-0068442 A | 6/2011 |
| KR | 10-2013-0013420 A | 2/2013 |
| TW | M408051 U1 | 7/2011 |
| WO | WO 2004/047421 A2 | 8/2004 |

* cited by examiner

[FIG. 1]
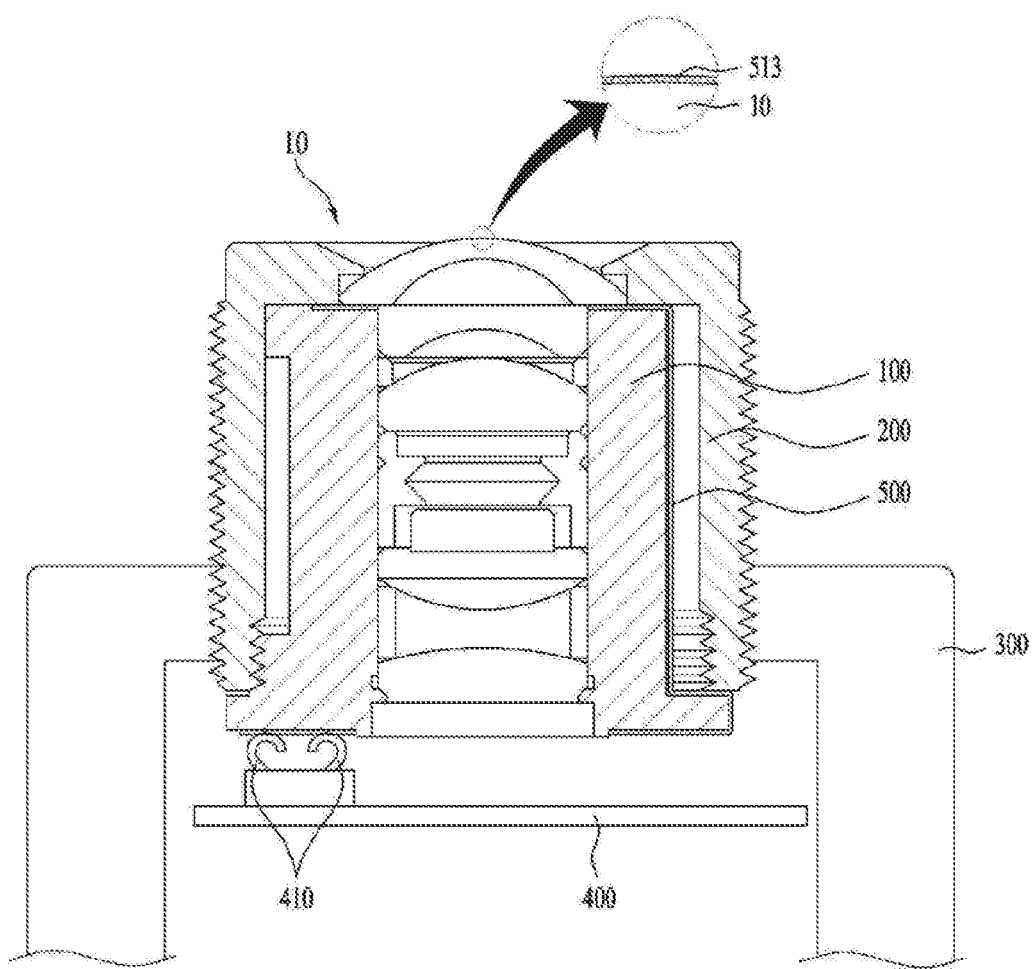

[FIG. 2]
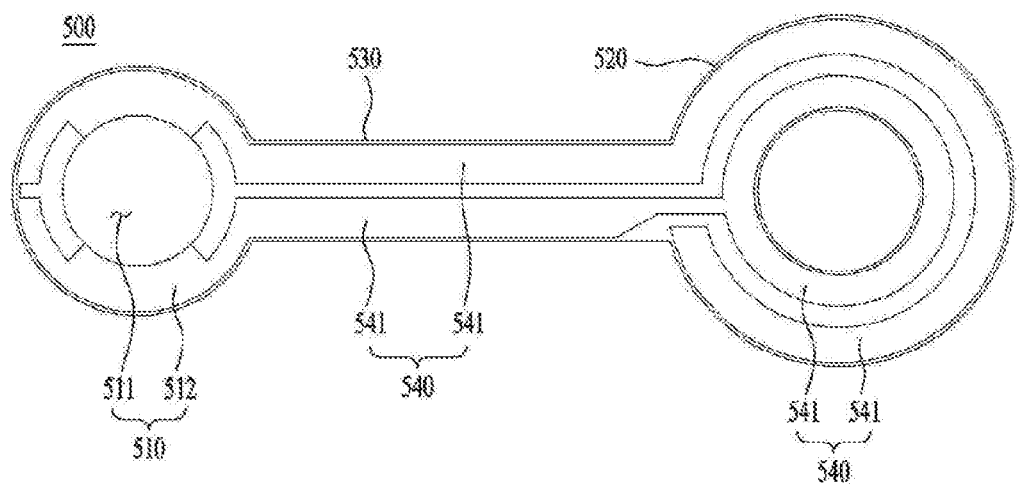
[FIG. 3]
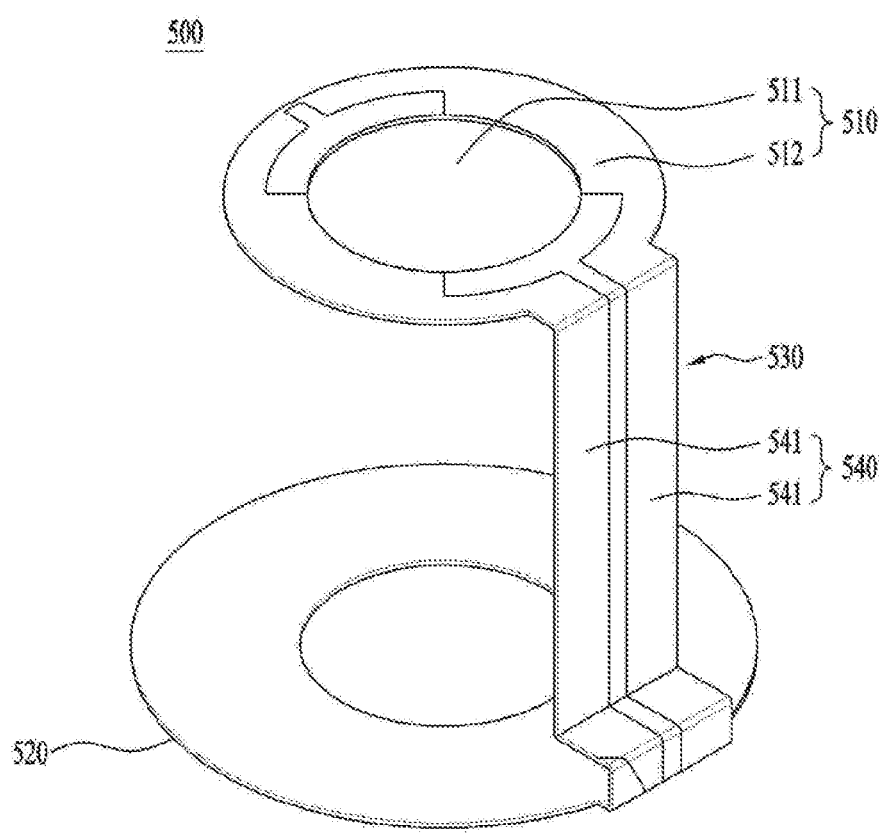

[FIG. 4]
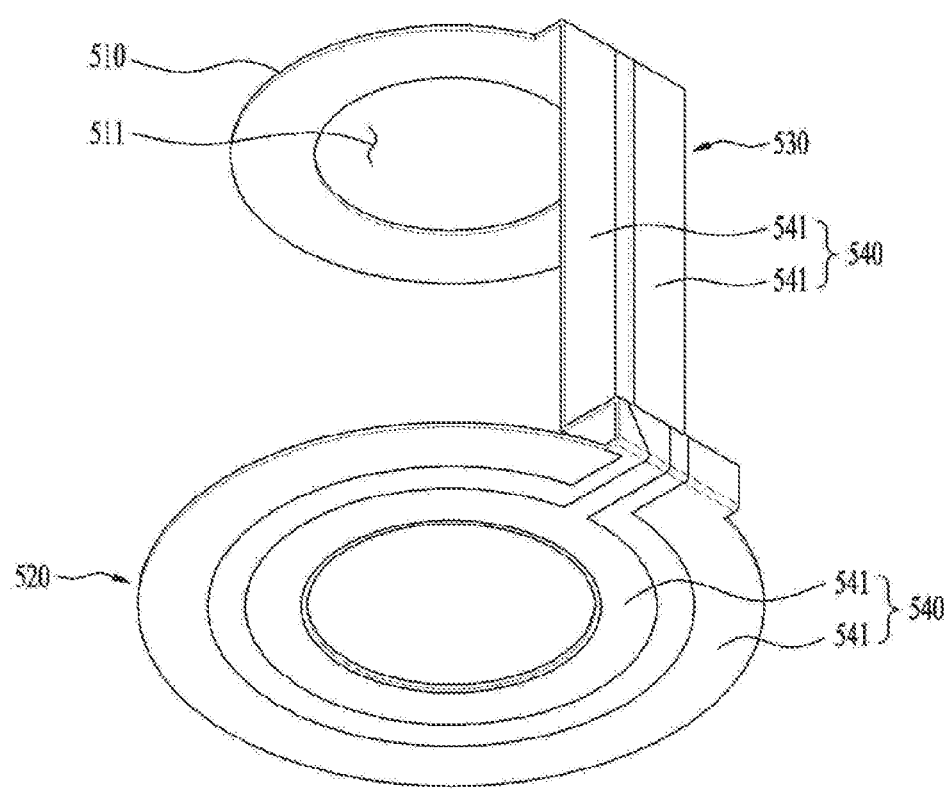

[FIG. 5]
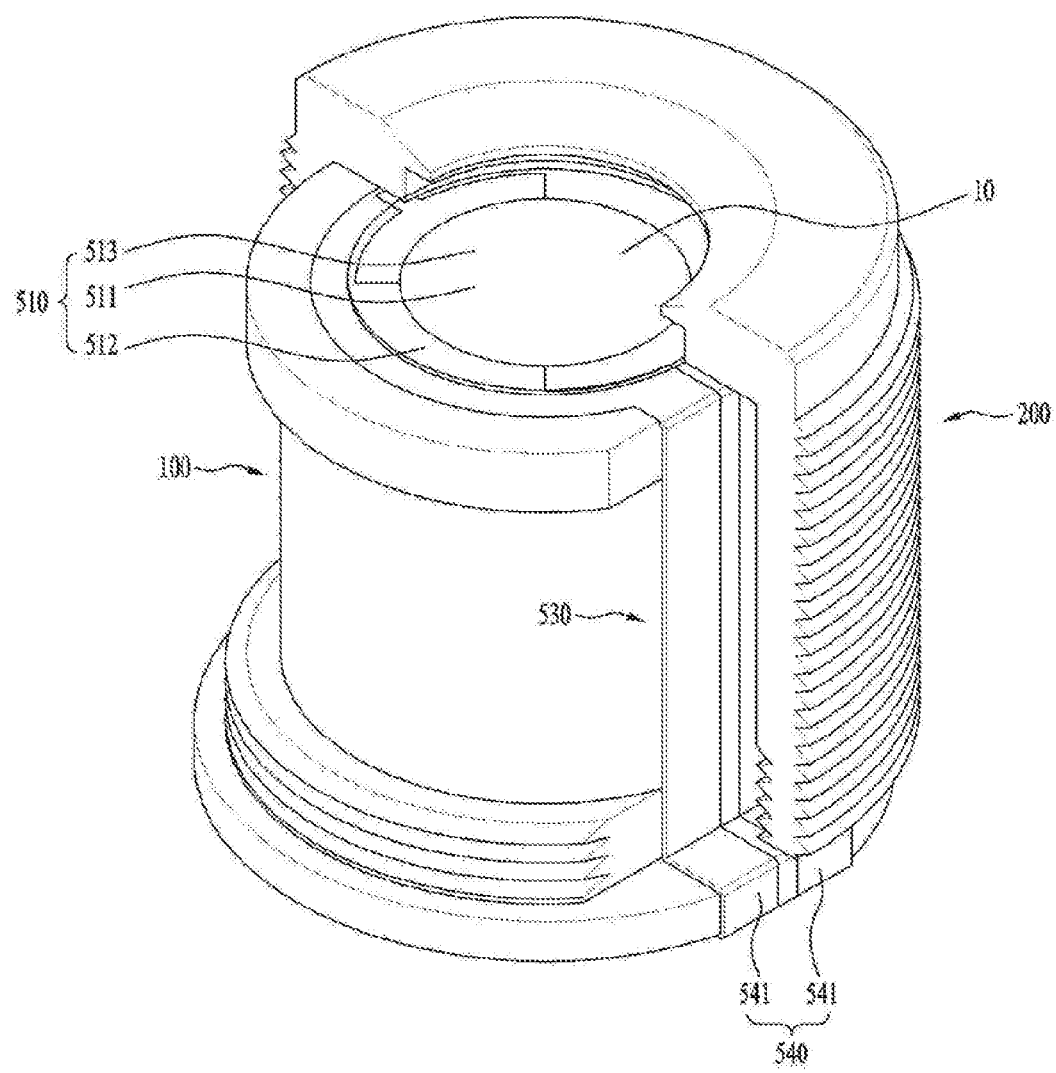

[FIG. 6]
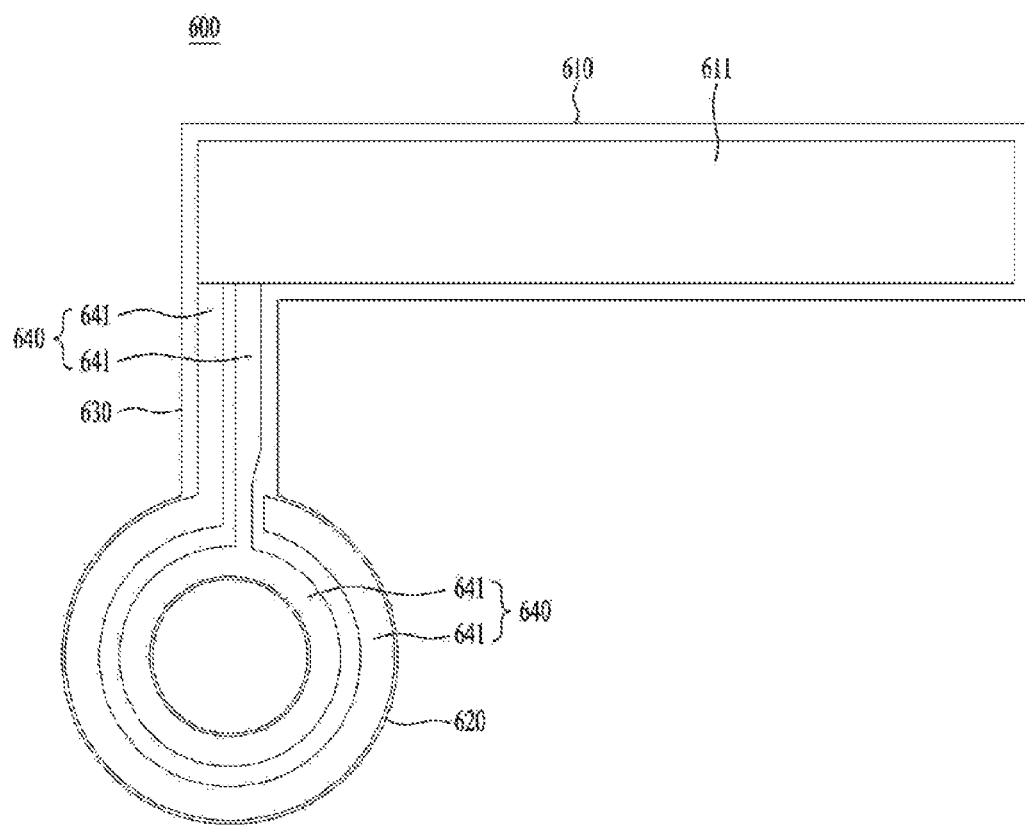

[FIG. 7]
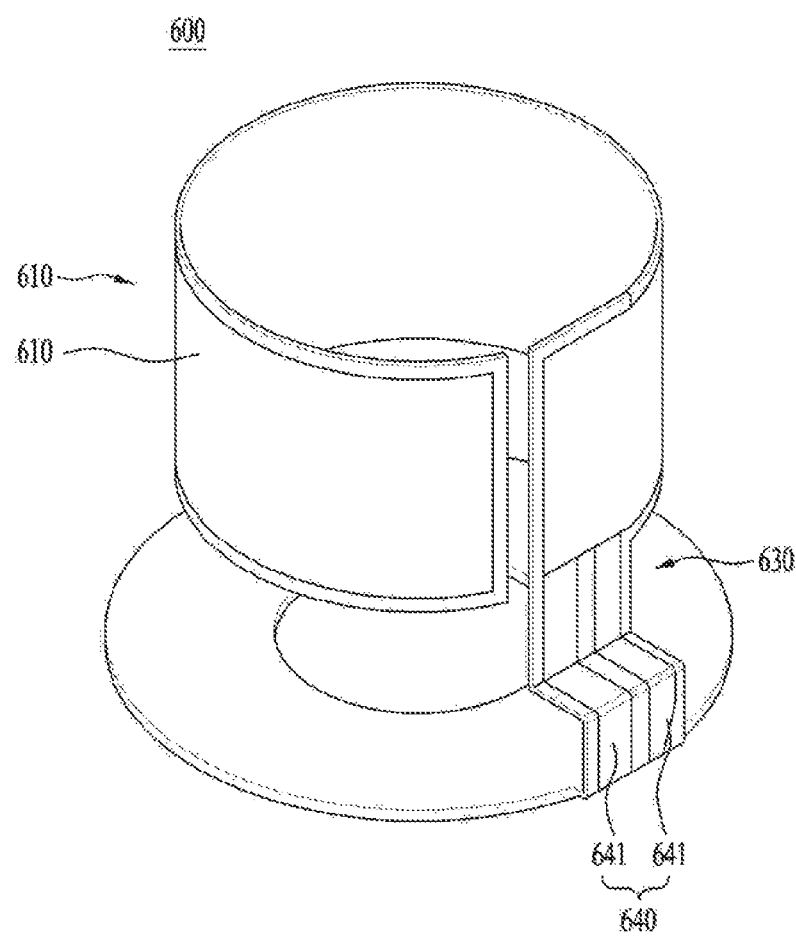

[FIG. 8]
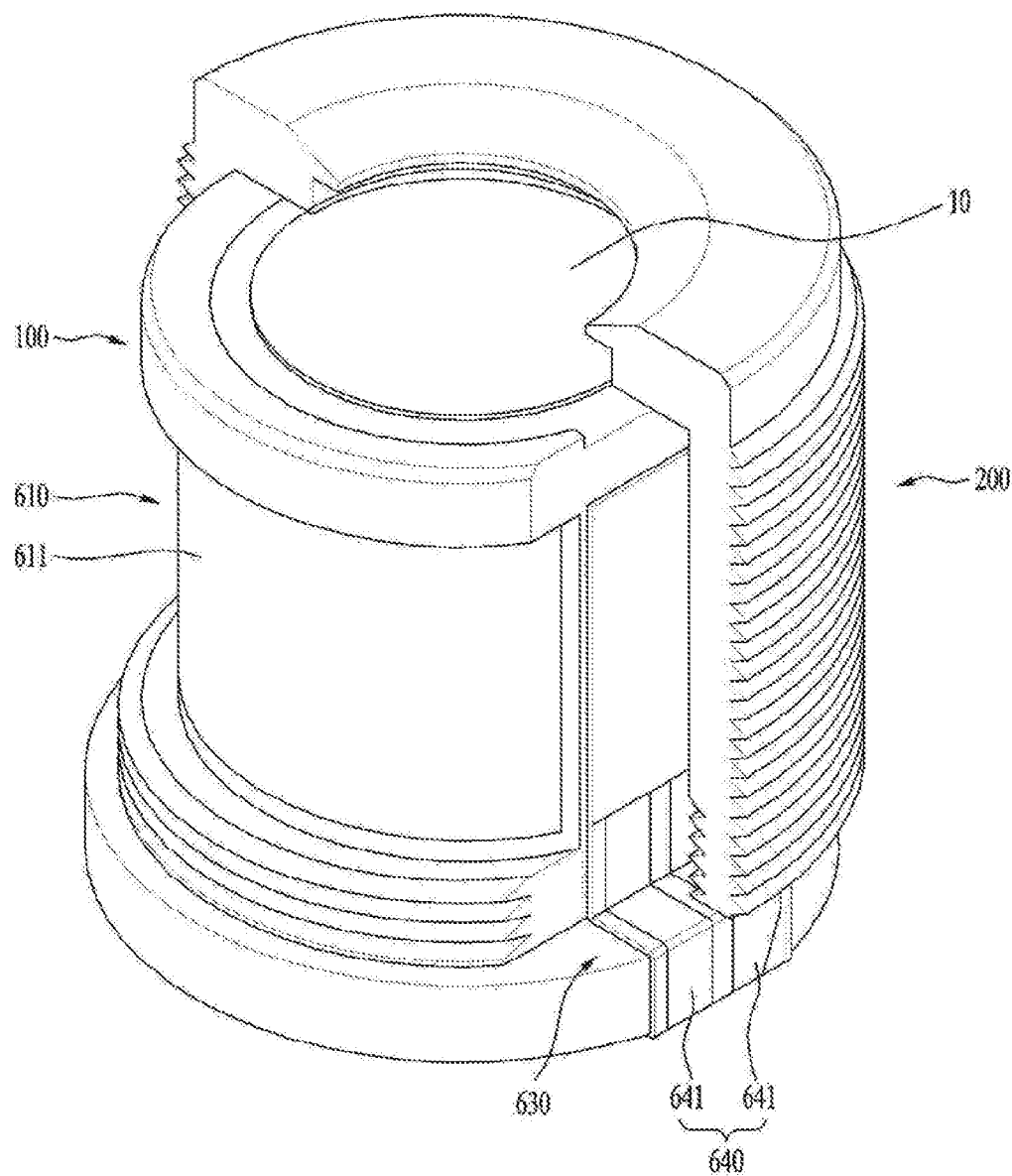

[FIG. 9]
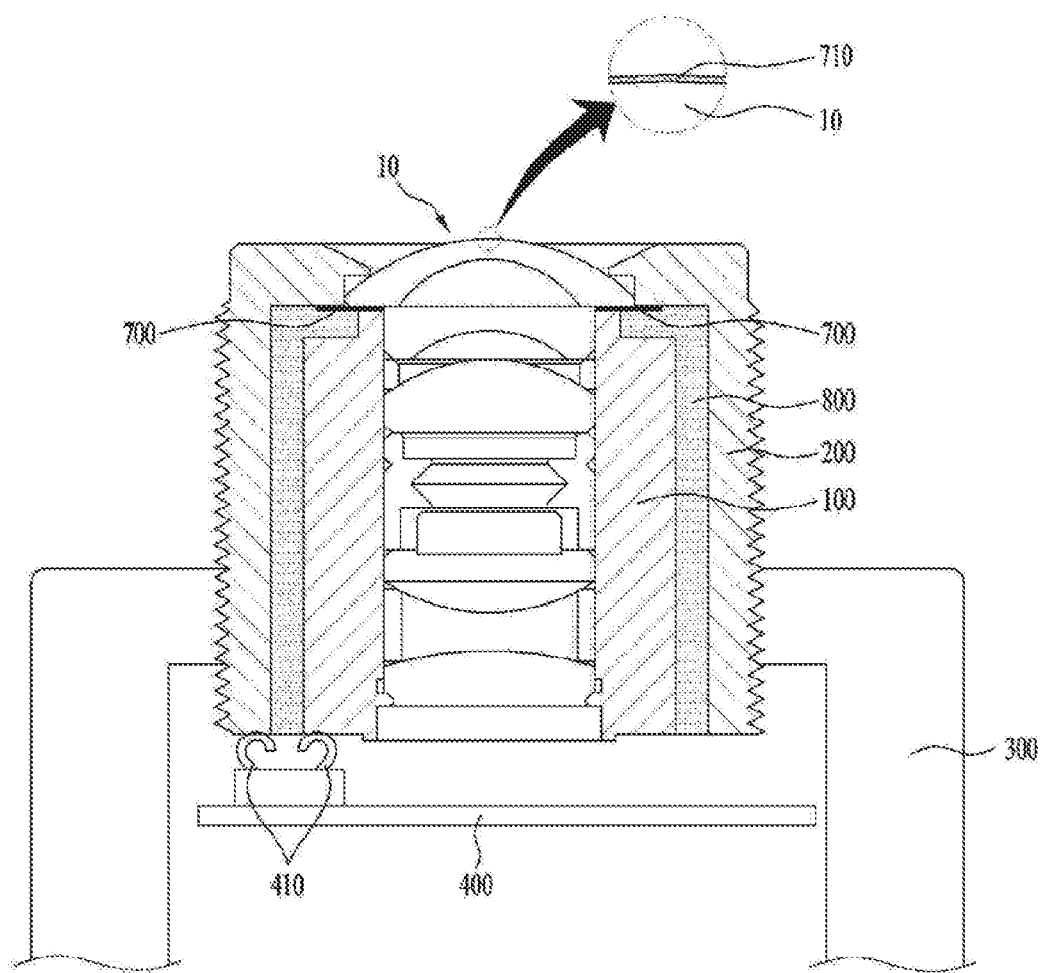

[FIG. 10]
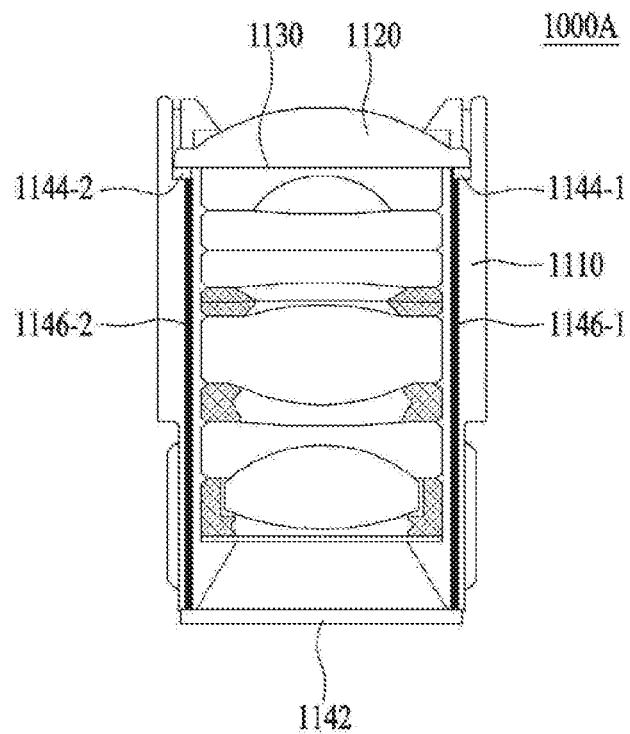
[FIG. 11]
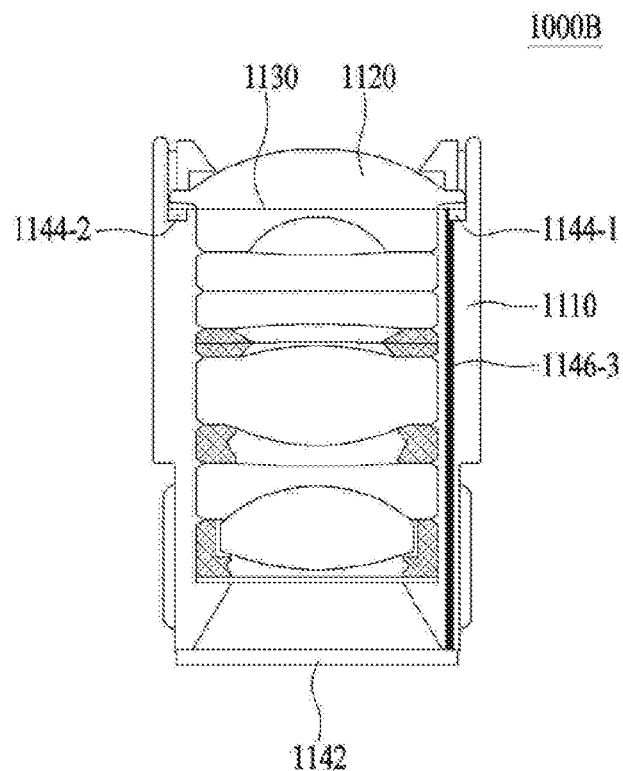

[FIG. 12]
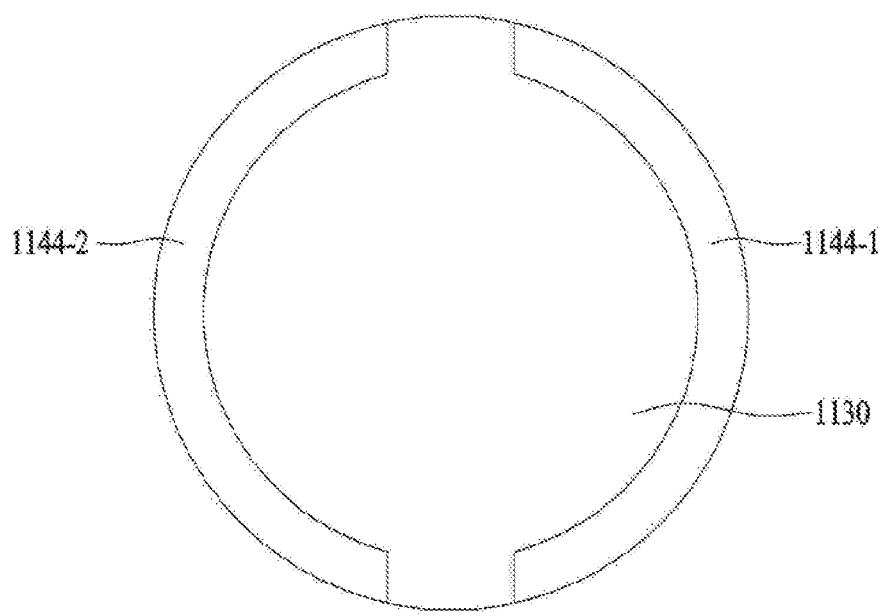
[FIG. 13]
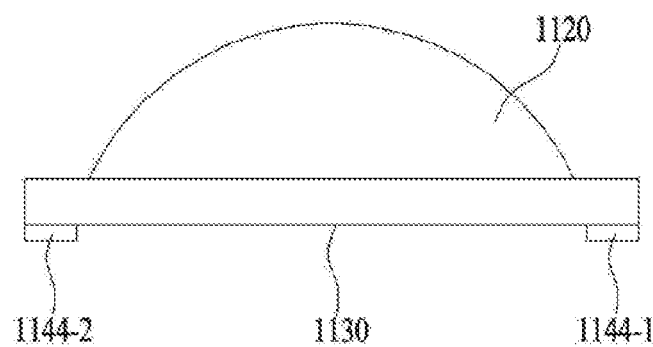

[FIG. 14]
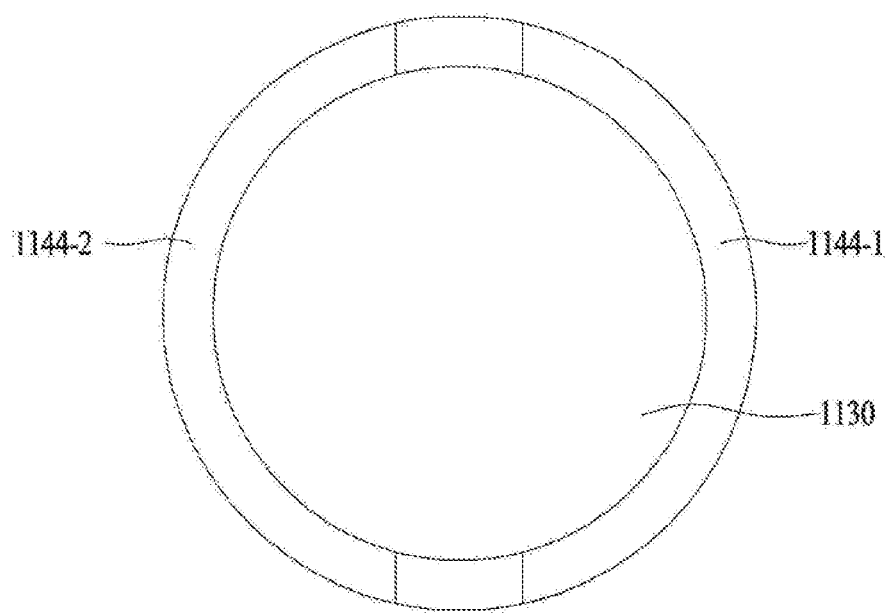
[FIG. 15]
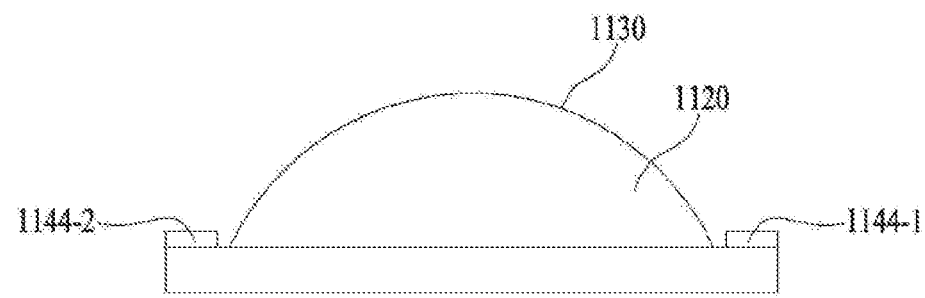

[FIG. 16]
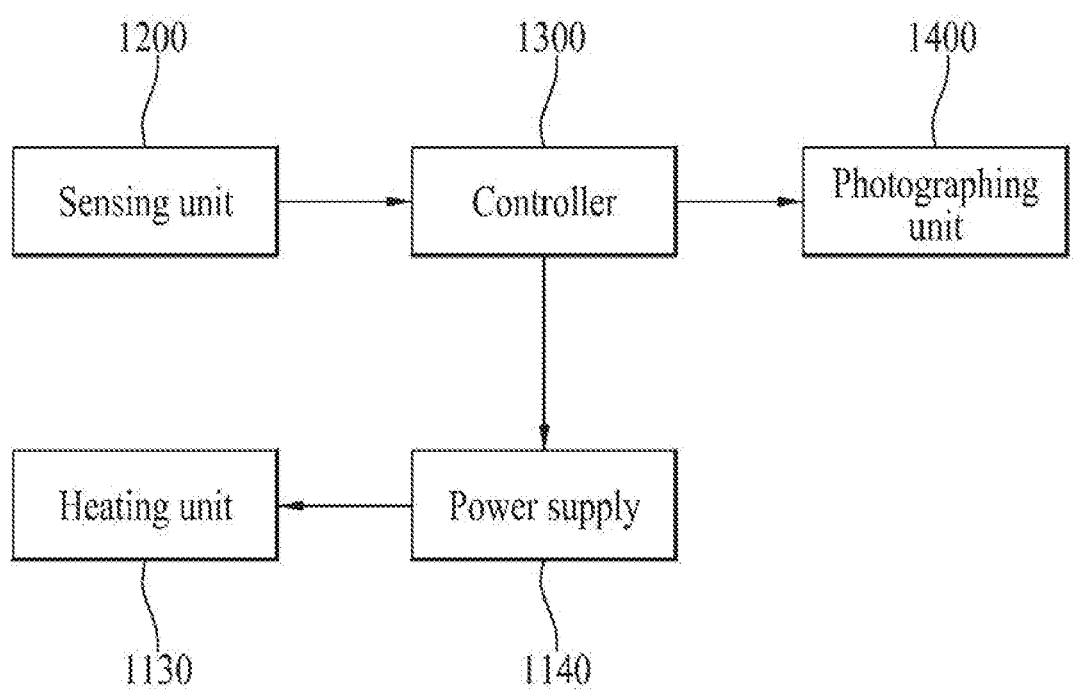

LENS BARREL AND CAMERA MODULE COMPRISING SAME

CROSS REFERENCE TO RELATED APPLICATIONS

This application is the National Phase of PCT International Application No. PCT/KR2016/005879, filed on Jun. 3, 2016, which claims priority under 35 U.S.C. 119(a) to Patent Application No. 10-2015-0078601, filed in the Republic of Korea on Jun. 3, 2015, and to Patent Application No. 10-2015-0140713, filed in the Republic of Korea on Oct. 7, 2015, all of which are hereby expressly incorporated by reference into the present application.

TECHNICAL FIELD

Embodiments relate to a lens barrel and a camera module including the same.

BACKGROUND ART

In general, when the vehicle is driven, the situation at the rear as well as the situation in front of the vehicle is a very important factor. Particularly, when the vehicle changes lanes or reverses, it is necessary to correctly recognize the situations at the rear side and the rear left and right sides to prevent an accident.

In changing lanes or reversing the vehicle, the driver determines the situation at the rear side or the rear left or right side through the both side mirrors protruding on both sides of the vehicle body or the rear-view mirror mounted on the inside of the vehicle, and then performs lane change or reversing when the vehicles traveling behind the driver's vehicle are at a safe distance or it is determined that there is no obstacle behind the drive's vehicle.

However, beginners, who are not accustomed to using the side mirrors and the rear-view mirror while driving to determine a rear situation, may cause a collision and have difficulty in correctly recognizing rear obstacles.

To address this issue, in recent years, a camera module is commonly installed at the front or rear of a vehicle to photograph front and rear traffic information and a subject and output the information through a display device provided in the vehicle to monitor a situation in front of or behind the vehicle, particularly, a blind spot situation so as to facilitate safe driving.

However, such a camera module is mounted on the front surface, rear surface, left side surface and right side surface of the vehicle and exposed to the outside. Accordingly, when it rains or snows or the temperature suddenly falls, the camera lens may be frosted or the surface of the lens may be covered with ice, thereby deteriorating the image quality and clarity of images.

Camera modules may be used in various fields. For example, they may be used for CCTVs, vehicle black boxes, rear cameras used in parking, and the like.

Camera modules used for security, vehicles, and the like may be used outdoors. Therefore, at least a part of the components of the camera module may be exposed to the outside. Particularly, since the lens, which is a component of the camera module, needs to be exposed to the outside to photograph a subject, it may be sensitive to the surrounding environment.

Particularly, when the ambient temperature falls below the freezing point, frost may be adhered to the exposed portion of the lens, which may hinder the light from entering the lens, disabling operation of the camera module or blurring or distorting a captured image.

Therefore, improvement is required.

DISCLOSURE

Technical Problem

Embodiments provide a lens barrel, a camera module including the lens barrel, and a vehicle image device including the same. More particularly, embodiments provide a lens barrel capable of eliminating frost or ice formed on a lens, a camera module including the lens barrel, and a vehicle image device including the same.

Embodiments also provide a camera module capable of preventing frost from being adhered to a lens by providing a heater which occupies a small area.

The technical objects that may be achieved through the embodiments are not limited to what has been particularly described hereinabove and other technical objects not described herein will be more clearly understood by those skilled in the art from the following detailed description.

Technical Solution

In one embodiment, a camera module may include a lens barrel having a hollow formed therein, the lens barrel being provided with at least one lens aligned in the hollow along an optical axis, a holder having an inner space formed therein and configured to accommodate a part of the lens barrel in the inner space, a casing having an inner space formed therein and configured to accommodate a printed circuit board in the inner space, the casing being coupled with the holder, and a first heater electrically connected to the printed circuit board and configured to heat the lens.

In another embodiment, a camera module may include a lens barrel having a hollow formed therein, the lens barrel being provided with at least one lens aligned in the hollow along an optical axis, a holder having an inner space formed therein and configured to accommodate a part of the lens barrel in the inner space, a casing having an inner space formed therein and configured to accommodate a printed circuit board in the inner space, the casing being coupled with the holder, and a second heater electrically connected to the printed circuit board, a part of the second heater being disposed between an outer circumferential surface of the lens barrel and an inner circumferential surface of the holder to heat the lens barrel and the lens.

In one embodiment, a lens barrel may include a housing, at least one lens disposed in the housing, a conductive heating member disposed on the at least one lens, and a power supply configured to apply power to the conductive heating member.

Advantageous Effects

In embodiments, since a heater occupying a small area can be mounted on a camera module, camera modules having a small volume while being equipped with the heater for removing the frost may be manufactured.

In embodiments, since the heater mounted on the camera module may be used to remove frost, malfunction of the camera module and deterioration of quality of captured images caused by the frost adhered to the camera module may be prevented.

In embodiments, since an external image may be captured by quickly removing the frost or ice formed on the lens, clear images may be provided to the driver.

DESCRIPTION OF DRAWINGS

FIG. 1 is a cross-sectional view illustrating a camera module according to an embodiment.

FIG. 2 is an exploded view illustrating a first heater according to an embodiment.

FIG. 3 is a perspective view illustrating the first heater according to an embodiment.

FIG. 4 is a bottom perspective view illustrating the first heater according to an embodiment.

For simplicity, a first coating layer provided on the first heater is not shown in FIGS. 2 to 4.

FIG. 5 is a view illustrating the first heater mounted on a camera module according to an embodiment.

FIG. 6 is an exploded view illustrating a second heater according to an embodiment.

FIG. 7 is a perspective view illustrating the second heater according to an embodiment.

FIG. 8 is a view illustrating the second heater mounted on a camera module according to an embodiment.

FIG. 9 is a cross-sectional view illustrating a camera module according to another embodiment. FIG. 9 shows the structure of the camera module equipped with a third heater.

FIGS. 10 and 11 are cross-sectional views illustrating a lens barrel according to an embodiment.

FIG. 12 is a bottom view illustrating a lens according to an embodiment.

FIG. 13 is a cross-sectional view of FIG. 12.

FIG. 14 is a plan view illustrating a lens according to another embodiment.

FIG. 15 is a plan view of FIG. 14.

FIG. 16 is a block diagram illustrating a camera module according to yet another embodiment.

BEST MODE

Hereinafter, embodiments will be described in detail with reference to the accompanying drawings. While the disclosure is susceptible to various modifications and alternative forms, specific embodiments thereof are shown by way of example in the drawings. However, the disclosure should not be construed as limited to the embodiments set forth herein, but on the contrary, the disclosure is to cover all modifications, equivalents, and alternatives falling within the spirit and scope of the embodiments. The sizes and shapes of the components shown in the drawings may be exaggerated for clarity and convenience.

It may be understood that, although the terms "first," "second," etc. may be used herein to describe various elements, these elements are not to be limited by these terms. These terms are only used to distinguish one element from another. In addition, terms particularly defined in consideration of the construction and operation of the embodiments are used only to describe the embodiments and do not limit the scope of the embodiments.

In the description of the embodiments, it is to be understood that when an element is described as being "on" or "under" another element, it may be "directly" on or under another element or may be "indirectly" formed such that one or more other intervening elements are also present between the two elements. In addition, when an element is described as being "on" or "under," the term "on" or "under" may refer to not only the upper side but also the lower side with respect to the element.

It is also to be understood that relational terms, such as on/upper portion/above and under/lower portion/below, are used only to distinguish between one subject or element and another subject or element without necessarily requiring or involving any physical or logical relationship or sequence between such subjects or elements.

FIG. 1 is a cross-sectional view illustrating a camera module according to an embodiment. As shown in FIG. 1, the camera module of the embodiment may include a lens barrel 100, a holder 200, a casing 300, a printed circuit board 400, and a first heater 500.

The lens barrel 100 may have a hollow and at least one lens 10 aligned along the optical axis may be provided in the hollow. The lens 10 coupled to the lens barrel 100 may be configured with a single lens, or a plurality of lenses 10 may be configured to form an optical system. FIG. 1 illustrates a structure in which a plurality of lenses 10 is aligned along the optical axis in the lens barrel 100 to form an optical system.

The holder 200 may accommodate a part of the lens barrel 100. To this end, an inner space may be defined in the holder 200, and a part of the lens barrel 100 may be accommodated in the inner space. The lens barrel 100 may be coupled to the holder 200 in a manner of screw coupling or adhesive bonding.

For example, as shown in FIG. 1, in the case of screw coupling, male threads may be formed on at least a part of the outer circumferential surface of the lens barrel 100, and corresponding female threads may be formed on the inner circumferential surface of the lens barrel 100 such that the lens barrel 100 and the holder 200 may be screwed to each other.

Similar to the lens barrel 100, the holder 200 may have a hollow. When the lens barrel 100 and the holder 200 are coupled to each other, the hollow of the lens barrel 100 and the hollow of the holder 200 are arranged to face each other along the optical axis, and light may be incident on the inside of the camera module along the optical axis through the lens 10 mounted across the hollow of the lens barrel 100 and the hollow of the holder 200.

Further, the holder 200 may contact the lens disposed at the upper portion of the lens barrel 100, and may also contact a first heating unit 510, which will be described later. In addition, an O-ring may be disposed between the holder 200 and the lens disposed in the upper portion of the lens barrel 100 to block foreign substances from entering the holder 200.

An inner space may be defined in the casing 300, a printed circuit board 400 may be accommodated in the inner space, and the casing 300 may be coupled with the holder 200. Here, the casing 300 and the holder 200 may be coupled to each other by screw coupling or adhesive bonding.

For example, in the case of screw coupling, as shown in FIG. 1, a hollow may be defined in the casing 300, female threads may be formed on the inner circumferential surface of the hollow, and corresponding male threads may be formed on the outer circumferential surface of the holder 200 such that the casing 300 and the holder 200 may be screw-coupled to each other.

The printed circuit board 400 may be housed in the casing 300, and an image sensor (not shown) having a portion on which an image of a subject is formed may be mounted on the upper surface of the printed circuit board.

In addition, the printed circuit board 400 may be supplied with power from the outside, and the supplied power may be supplied to the first heater 500 electrically connected to the printed circuit board and be used to heat the first heater 500.

In addition, various circuit elements may be formed or provided on the printed circuit board 400 to transmit an image signal of the image formed on the image sensor to other devices or components or to receive power from an external power source.

Meanwhile, the printed circuit board 400 may be provided with a connector 410. Referring to FIGS. 1 and 2, the connector 410 may electrically connect a first terminal 520, which is provided to the first heater 500, with the printed circuit board 400.

Referring to FIGS. 1 and 2, for example, a pair of connectors 410 may be provided. The pair of connectors 410 may be electrically connected to a first conductive wire 541 formed on the first terminal 520 of the first heater 500.

Here, a plurality of pairs of connectors 410 may be provided to prevent disconnection between the connectors 410 and the first conductive wire 541. That is, the plurality of pairs of connectors 410 may be arranged in the circumferential direction of the first terminal 520, such that, even if any one pair of connectors 410 is disconnected from the first conductor 541, the other pairs of connectors 410 maintain electrical connection with the first conductor 541.

The connectors 410 may be formed of a resilient material or have a resilient shape. In one embodiment, referring to the connectors 410 of FIG. 1, the connectors may have a curved shape so as to have elasticity.

The first heater 500 may be electrically connected to the printed circuit board 400 and may be heated by the power supplied through the printed circuit board 400, thereby heating the lens 10, particularly, a portion of the lens 10 exposed to the outside.

A portion of the lens 10 may be exposed to the outside and thus be affected by the surrounding environment. In particular, when the ambient temperature is below freezing, frost may adhere to the exposed portion of the lens 10.

The frost may make the lens 10 opaque or significantly reduce transparency of the lens, thereby obstructing incidence of light onto the lens 10 and disabling operation of the camera module. Thereby, a blurred image or distorted image may be captured.

Therefore, in an embodiment, in order to prevent frost from being adhered to the exposed portion of the lens 10, the first heater 500 may be used to heat the lens 10, particularly, the exposed portion of the lens 10, namely the upper portion of the lens 10 shown in FIG. 1.

Here, it is appropriate to design the structure of the first heater 500 so as to be simple and occupy a small space and to adopt a heating technique supporting the design. Therefore, for example, an electric resistance heating technique may be used for the first heater 500.

FIG. 2 is an exploded view illustrating a first heater 500 according to an embodiment. FIG. 3 is a perspective view illustrating the first heater 500 according to an embodiment. FIG. 4 is a bottom perspective view illustrating the first heater 500 according to an embodiment. For simplicity, a first coating layer 513 provided on the first heater is not shown in FIGS. 2 to 4.

As shown in FIGS. 2 to 4, the first heater 500 may include a first heating unit 510, a first terminal 520, a first connecting portion 530, and a first electrode 540.

The first heating unit 510 may serve to heat the lens 10 and may include a through-hole 511, a first heating plate 512 and a first coating layer 513. The first heating plate 512 may be electrically connected to the first electrode 540 and may be heated by power supplied thereto through the first electrode 540. Here, the first heating plate 512 may be configured to be heated by, for example, the electric resistance heating technique as described above.

The through-hole 511 may be formed in the first heating plate 512. When the first heating unit 510 is mounted on the camera module, an upper portion of the lens 10 may be mounted in the through-hole 511. According to this structure, the first heating plate 512 may be disposed on the upper portion of the lens 10 to heat the upper portion of the lens 10 and the exposed portion of the lens 10.

The first heating unit 510 may be provided with the first coating layer 513 capable of heating the upper portion of the lens 10 and the exposed portion of the lens 10, together with the first heating plate 512. The first coating layer 513 will be described in detail below.

The first terminal 520 may be electrically connected to the printed circuit board 400 to receive power from the printed circuit board 400. As illustrated in FIG. 1, the printed circuit board 400 may be provided with the connectors 410 for electrical connection between the first terminal 520 and the printed circuit board 400.

The first connecting portion 530 may connect the first heating unit 510 to the first terminal 520. In order for the first connection portion 530 to electrically connect the first heating plate 512 to the first terminal 520, the first connection portion 530 may be provided with the first electrode 540. Of course, as shown in FIGS. 2 to 4, the first terminal 520 may also be provided with the first electrode 540.

The first electrode 540 may be provided to the first terminal 520 and the first connecting portion 530 to electrically connect the printed circuit board 400 to the first heating plate 512, and may include a first conductive wire 541.

Specifically, the first electrode 540 may have two first conductive wires 541 separated from each other and provided to the first terminal 520 and the first connecting portion 530, and the two first conductive wires 541 may be electrically connected to the first heating plate 512.

The two separated first conductive wires 541 may be electrically connected to a pair of connectors 410, which are provided to the first terminal 520, respectively. Thus, the printed circuit board 400 may be electrically connected to the first heating plate 512 through the connectors 410 and the first conductive wires 541, and the first heating plate 512 may be heated by power supplied from the printed circuit board 400.

Meanwhile, the first heating plate 512 and the first electrode 540 may be printed on the first heater 500, for example. All parts of the first heater 500 except the first heating plate 512, the first electrode 540 and the first coating layer 513 may be formed of an electrically insulating material, particularly, in order to prevent the pair of first conductive wires 541 of the first electrode 540 from being short-circuited.

FIG. 5 is a view illustrating the first heater 500 mounted on a camera module according to an embodiment. As shown in FIG. 5, the first heating unit 510 may include a first coating layer 513.

The first coating layer 513 may be formed of a transparent material. The first coating layer 513 may be arranged such that an edge portion thereof is attached to the first heating plate 512 and a center portion thereof is attached to the surface of the lens 10.

Similar to the first heating plate 512, the first coating layer 513 may serve to heat the upper portion and the exposed portion of the lens 10. Accordingly, the first coating layer 513 may be provided to be heated by power supplied thereto using, for example, the electric resistance heating technique.

To this end, the first coating layer 513 may be formed of a conductive material. The first coating layer 513 may be attached to the first heating plate 512 by, for example, a conductive adhesive, and may be heated by power supplied through the first heating plate 512.

In addition, since the central portion of the first coating layer 513 is attached to the surface of the lens 10, it is appropriate that the first coating layer 513 is formed of a transparent material such that light can pass therethrough. Accordingly, it is appropriate that the first coating layer 513 is formed of a transparent conductive material.

While the first coating layer 513 is illustrated as being disposed on the upper surface of the lens 10, embodiments are not limited thereto. The first coating layer 513 may be disposed on the lower surface of the lens 10 and may extend to the edge of the lower surface of the lens 10.

It is appropriate that the first coating layer 513 is formed of, for example, indium tin oxide. This is because indium tin oxide is transparent and conductive.

As shown in FIGS. 1 and 5, at least a part of the first heater 500, that is, the first heating unit 510 and the first connecting portion 530 may be interposed between the lens barrel 100 and the holder 200, and the first terminal 520 may be disposed on the lower surface of the lens barrel 100.

In order for the first heater 500 to be arranged in the above-described structure, the first heater 500 shown in the exploded view of FIG. 2 needs to be processed into a three-dimensional shape as shown in FIGS. 3 and 4.

FIG. 6 is an exploded view illustrating a second heater 600 according to an embodiment. FIG. 7 is a perspective view illustrating the second heater 600 according to an embodiment. The second heater 600 may be mounted on the camera module including the lens 10, the lens barrel 100, the holder 200, the casing 300 and the printed circuit board 400 shown in FIG. 1.

Since the view of the second heater 600 mounted on the camera module including the lens 10, the lens barrel 100, the holder 200, the casing 300, and the printed circuit board 400 can be clearly derived from FIG. 1, description of the same will be omitted.

The second heater 600 may be electrically connected to the printed circuit board 400 and may be heated by the power supplied through the printed circuit board 400, thereby heating the lens barrel 100 and the lens 10. In the embodiment, the second heater 600 is used to heat the lens barrel 100 and the lens 10 coupled to the lens barrel 100 in order to prevent frost from being adhered to the exposed portion of the lens 10.

Here, it is appropriate to design the structure of the second heater 600 so as to be simple and occupy a small space and to adopt a heating technique supporting the design. Therefore, for example, an electric resistance heating technique may be used for the second heater 600. The second heater 600 may include a second heating portion 610, a second terminal 620, a second connecting portion 630, and a second electrode 640.

The second heating portion 610 may be disposed to surround the outer circumferential surface of the lens barrel 100 to heat the lens barrel 100 and the lens 10 and may include a second heating plate 611. The second heating plate 611 may be electrically connected to the second electrode 640 and may be heated by the power supplied through the second electrode 640. Here, the second heating plate 612 may be configured to be heated by, for example, the electric resistance heating technique as described above.

The second terminal portion 620 may be electrically connected to the printed circuit board 400 to receive power from the printed circuit board 400. Referring to FIG. 1, the printed circuit board 400 may be provided with the connectors 410 for electrical connection between the second terminal 620 and the printed circuit board 400.

The second connecting portion 630 may connect the second heating portion 610 to the second terminal 620. In order for the second connection portion 630 to electrically connect the second heating plate 611 to the second terminal 620, the second connecting portion 630 may be provided with the second electrode 640. Of course, as shown in FIGS. 6 and 7, the second terminal 620 may also be provided with the second electrode 640.

The second electrode 640 may be provided to the second terminal 620 and the second connecting portion 630 to electrically connect the printed circuit board 400 to the second heating plate 612, and may include a second conductive wire 641.

Specifically, the second electrode 640 may have two second conductive wires 641 separated from each other and provided to the second terminal 620 and the second connecting portion 630, and the two second conductive wires 641 may be electrically connected to the second heating plate 611.

The two separated second conductive wires 641 may be electrically connected to a pair of connectors 410, which are provided to the second terminal 620, respectively. Thus, the printed circuit board 400 may be electrically connected to the second heating plate 611 through the connectors 410 and the second conductive wires 641, and the second heating plate 611 may be heated by power supplied from the printed circuit board 400.

Meanwhile, the second heating plate 611 and the second electrode 640 may be printed on the second heater 600, for example. All parts of the second heater 600 except the second heating plate 611 and the second electrode 640 may be formed of an electrically insulating material, particularly, in order to prevent the pair of second conductive wires 641 of the second electrode 640 from being short-circuited.

FIG. 8 is a view illustrating the second heater 600 mounted on a camera module according to an embodiment. As shown in FIG. 8, a part of the second heater 600, that is, the second heating portion 610 and the second connecting portion 630 may be interposed between the lens barrel 100 and the holder 200, and the terminal portion 620 may be disposed on the lower surface of the lens barrel 100.

Particularly, the second heating portion 610 may be disposed between the outer circumferential surface of the lens barrel 100 and the inner circumferential surface of the holder 200 so as to surround the outer circumferential surface of the lens barrel 100.

The second heating plate 611 provided to the second heating portion 610 may be heated, and the heat may be transferred to the lens barrel 100 and the lens 10 coupled to the lens barrel 100. Thereby, the second heating plate 611 may heat the lens barrel 100 and the lens 10.

Accordingly, in the embodiment, the second heater 600 is used to heat the entire lens 10 in order to prevent frost from being adhered to the exposed portion of the lens 10.

In order to arrange the second heater 600 configured as above in the camera module, the second heater 600 shown in the exploded view in FIG. 6 needs to be processed into a three-dimensional shape as shown in FIGS. 7 and 8.

FIG. 9 is a cross-sectional view illustrating a camera module according to another embodiment. FIG. 9 shows the structure of the camera module equipped with a third heater 700. The camera module of the embodiment may include a lens barrel 100, a holder 200, a casing 300, a printed circuit board 400, a third heater 700, a second coating layer 710, an electric insulation layer 800, and a connector 410.

The lens barrel 100, the holder 200, and the casing 300 are the same as or similar in structure and function to those of the above-described embodiment, and thus a detailed description thereof will be omitted. However, the structures of the lens barrel 100 and the holder 200 may be slightly different from those described above as a space for interposing the electric insulation layer 800 between the lens barrel 100 and the holder 200 should be provided.

The electric insulation layer 800 may be interposed between the lens barrel 100 and the holder 200 to electrically isolate the lens barrel 100 from the holder 200. In the camera module of the embodiment, since the lens barrel 100 and the holder 200 serve as conductors for electrically connecting the printed circuit board 400 and the third heater 700 to each other and need to be prevented from being short-circuited, the electric insulation layer 800 may serve to prevent the lens barrel 100 and the holder 200 from being short-circuited.

The third heater 700 may be electrically connected to the lens barrel 100 and the holder 200 and serve to heat the lens 10. The third heater 700 may be disposed at the upper portion of the lens 10 as in the case of the first heating unit 510 and/or the first heating plate 512, and thus may heat the upper portion and the exposed portion of the lens 10.

The third heater 700 may be formed in a ring shape and may include a second coating layer 710. The second coating layer 710 may be formed of a transparent conductive material, and a central portion thereof may be attached to the surface of the lens 10 and be heated by power supplied thereto.

The second coating layer 710 may be disposed on the lower surface of the lens 10 so as to be in contact with the first heating plate 512 or the third heater 700 to be supplied with electric power, and may be heated as electric power is supplied.

Since the second coating layer 710 is the same as or similar in structure, material and function to the first coating layer 513 except that the second coating layer 710 is provided to the third heater 700, a further detailed description of the second coating layer 710 will be omitted.

In the embodiment, the printed circuit board 400 may be accommodated in an internal space formed in the casing 300 and may be electrically connected to the lens barrel 100 and the holder 200 to supply power to the third heater 700.

The structure of the printed circuit board 400 of this embodiment is the same as or similar to the structure of the printed circuit board 400 of FIG. 1 except that the printed circuit board 400 of this embodiment is electrically connected to the lens barrel 100 and the holder 200. The printed circuit board 400 may supply power to the third heater 700 and the second coating layer 710 via the lens barrel 100 and the holder 200.

As shown in FIG. 9, the printed circuit board 400 may include a connector 410. The connectors 410 have the same or similar structure as that of the connectors 410 shown in FIG. 1, but function to connect the printed circuit board 400 to the lens barrel 100 and the holder 200.

Therefore, the connectors 410, which are provided in a pair, may electrically connect the lens barrel 100 and the holder 200, respectively.

In the embodiment, the third heater 700 may heat the upper portion of the lens 10 and the externally exposed portion of the lens 10, thereby preventing adhesion of frost to the exposed portion of the lens 10.

In an embodiment, since a heater occupying a small space can be mounted on the camera module, camera modules having a small volume while being equipped with the heater for removing frost may be manufactured.

In an embodiment, since the heater mounted on the camera module may be used to remove frost, malfunction of the camera module and deterioration in quality of captured images caused by the frost adhered to the camera module may be prevented.

FIGS. 10 and 11 are cross-sectional views illustrating a lens barrel according to an embodiment.

Referring to FIGS. 10 and 11, a lens barrel 1000A, 1000B according to this embodiment includes a housing 1110, a lens 1120, a conductive heating member 1130, and a power supply.

In an embodiment, the housing 1110 may be injection molded using metal or synthetic resin, and may be formed in a shape of a cabinet having an accommodation space formed therein.

At least one lens 1120 may be disposed in the inner space of the housing 1110. In addition, the at least one lens may include a plurality of lenses, and the plurality of lenses may be arranged at predetermined intervals in a stacked manner in the inner space of the housing 1110.

The conductive heating member 1130 may be disposed on at least one lens. When a plurality of lenses is stacked and arranged in the housing 1110, the conductive heating member 1130 may be disposed on the lens 1120 arranged at the uppermost side.

In addition, the conductive heating member 1130 may be formed to be transparent so as to be disposed on the lens such that a clear image of the surroundings may be captured.

Here, the conductive heating member 1130 may include at least one of carbon nanotube (CNT) and graphene, which have high transmittance and high thermal conductivity.

The conductive heating member 1130 disposed on the lens 1120 may be deposited or applied onto the entire surface of the lens by a plasma chemical vapor deposition technique or the like. Alternatively, the conductive heating member 1130 may be locally disposed on the surface of the lens. For example, it may have a structure like a nano-mesh structure, which is capable of uniformly transferring heat to the lens surface while not being disposed over the entire lens surface. The mesh size may be determined according to the area of the lens surface on which the conductive heating member is disposed. Since this structure of the conductive heating member 1130 does not cover the entire surface of the lens, transparency of the lens may be further enhanced.

In addition, the conductive heating member may be adhered to the lens surface in the form of a film.

The transparency of the conductive heating member disposed on the lens is important in order to capture a clear image of the surroundings through the lens after the conductive heating member is disposed on the lens to remove frost and ice formed on the lens. The transparency may be determined by the thickness of the conductive heating member 1130 disposed on the lens. In an embodiment, the thickness of the conductive heating member including at least one of the carbon nanotube or graphene may be 1 nm to 2 nm.

Here, if the conductive heating member is excessively thin, the heat generation performance of the conductive heating member may be degraded. If the conductive heating member is excessively thick, transparency may be reduced, and thus a clear image may not be captured.

Therefore, the thickness of the conductive heating member may be determined according to the thermal conductivity and transparency of the conductive heating member depending on the material of the conductive heating member.

The thickness of the conductive heating member may be uniformly arranged over the surface of the lens such that the heat generated by the conductive heating member 1130 is uniformly transferred to the lens.

In addition, the power supply may apply power to the conductive heating member 1130 to heat the conductive heating member.

The power supply includes a power source, first and second electrodes 1144-1 and 1144-2, and first and second wires 1146-1 and 1146-2. The first and second electrodes 1144-1 and 1144-2 may be disposed at the edge of the conductive heating member 1130, but embodiments are not limited thereto.

FIG. 12 is a bottom view illustrating a lens according to an embodiment, and FIG. 13 is a cross-sectional view of FIG. 12. FIG. 14 is a plan view illustrating a lens according to another embodiment, and FIG. 15 is a plan view of FIG. 14.

Referring to FIGS. 12 to 14, when the conductive heating member 1130 is disposed on the upper surface of the lens 1120, the first and second electrodes 1144-1 and 1144-2 may be positioned on the lens 1120. When the conductive heating member 1130 is disposed on the lower surface of the lens 1120, the first and second electrodes 1144-1 and 1144-2 may be positioned under the lens 1120.

Referring to FIGS. 10 and 11, a printed circuit board 1142 on which an image sensor is mounted may be disposed below the housing 1110 of the lens barrel. A first electric wire and a second electric wire may be connected to the power source of the printed circuit board to supply electric current to the conductive heating member 1130 through the first and second electrodes 1144-1 and 1144-2. Therefore, electric power may be simply supplied to the conductive heating member by connecting the conductive heating member to the power source of the printed circuit board or the like disposed in the lens barrel without separately providing a power source for heating the conductive heating member.

The image sensor collects incident light to generate an image signal. The image sensor may be a complementary metal-oxide semiconductor (CMOS) sensor or a charge coupled device (CCD) sensor.

The first and second electric wires 1146-1 and 1146-2 are respectively disposed between the printed circuit board 1142 connected with the power source and the first and second electrodes 1144-1 and 1144-2 to connect the power source to the first and second wires 1146-1 and 1146-2, respectively. Here, the first wire 1146-1 may be connected to the positive electrode, and the second wire 1146-2 may be connected to the negative electrode.

When the housing 1110 includes a non-conductive material, the lens barrel 1000A may further include first and second connecting members 1146-1 and 1146-2 corresponding to the first and second wires 1146-1 and 1146-2.

The first connecting member 1146-1 may be connected to the positive electrode of the printed circuit board, on which the components disposed in the housing 1110 of the lens barrel are mounted, and the second connecting member 1146-2 may be connected to the negative electrode of the printed circuit board.

On the other hand, when the housing 1110 includes a conductive material, the lens barrel 1000B may further include a third connecting member 1146-3 corresponding to the first wire.

The third connecting member 1146-3 may be connected to the positive electrode of the printed circuit board, on which the components disposed in the housing 1110 of the lens barrel 1000B are mounted, and the second electrode 1144-2 disposed on the conductive heating member 1130 disposed on the lower surface of the lens 1120 may be in contact with one side of the housing 1110 to serve as a ground.

The first and second wires 1146-1 and 1146-2 may be connected to a printed circuit board on which the components disposed in the housing of the lens barrel are mounted, other than the printed circuit board on which the image sensor is mounted.

Meanwhile, the camera module may further include a cover (not shown) for covering an upper portion of the lens. The cover is provided to protect the lens from the outside when the camera module is not used, and may be disposed over the lens to selectively open and close the camera module.

FIG. 16 is a block diagram illustrating a camera module according to yet another embodiment.

As shown in FIG. 16, the camera module 10A according to this embodiment includes a heating unit 1130 contained in a lens barrel, a power supply 140, a sensing unit 1200, and a controller 300.

The heating portion 1130 may include a conductive heating member including at least one of carbon nanotube (CNT) and graphene, which have high transmittance and high thermal conductivity. The heating member may be heated by current applied thereto by the power supply 140 to remove the frost or ice formed on the lens of the camera that is exposed to the outside.

The sensing unit 1200 may be disposed at a position close to the lens to sense at least one of external humidity or temperature.

Meanwhile, the controller 300 may be provided to apply power to the conductive heating member according to at least one of the humidity or temperature sensed by the sensing unit 1200. For example, when the sensed humidity is greater than the pre-stored reference humidity, or the sensed temperature is below zero or below the dew point temperature, the controller 300 applies power to the heating unit 1130 through the power supply 140, causing the conductive heating member to generate heat.

The controller 300 may control at least one of the level of power applied to the conductive heating member or the power application time depending on the humidity or temperature sensed by the sensing unit as well as applying power to the conductive heating member.

When the moisture or ice is removed from the lens of the camera by heat generated from the conductive heating member, and thus the pre-stored reference humidity and temperature of the lens surface are reached, the controller 300 controls the photographing unit 400, which photographs an external target object through the image sensor, to generate and store an image signal.

As described above, according to embodiments, when moisture formed on the lens of the camera or the surface temperature of the lens lower than the reference temperature is sensed by the sensing unit 1200, the controller 300 may cause current to be supplied to the conductive heating member to heat the conductive heating member to remove frost from the lens, or control the heating temperature or the heating time of the conductive heating member according to the degree of freezing of the lens at a temperature lower than the reference temperature to quickly melt the ice on the surface of the lens.

Further, since the conductive heating member formed of a material having high transparency is disposed on the lens of the camera, clear captured images may be provided to the driver, and accordingly safe driving in a more pleasant environment may be ensured for the driver.

While only a few details have been described above in connection with the embodiments, various other implementations are possible. The technical contents of the embodiments described above may be combined in various forms other than mutually incompatible technologies, thereby implementing a new embodiment.

INDUSTRIAL APPLICABILITY

In embodiments, since a heater occupying a small area can be mounted on a camera module, a camera module having a small volume while being equipped with the heater for removing the frost may be manufactured. Therefore, the embodiments are industrially applicable.

The invention claimed is:

1. A camera module comprising:
   a lens barrel having a hollow formed therein, the lens barrel being provided with at least one lens aligned in the hollow along an optical axis;
   a holder having an inner space formed therein and configured to accommodate a part of the lens barrel in the inner space;
   a casing having an inner space formed therein and configured to accommodate a printed circuit board in the inner space, the casing being coupled with the holder; and
   a heater electrically connected to the printed circuit board and configured to heat the lens, the heater including:
   a heating unit configured to heat the lens;
   a terminal electrically connected to the printed circuit board to receive power from the printed circuit board; and
   a connecting portion connecting the heating unit and the terminal, a portion of the connecting portion being physically located between the lens barrel and the holder.

2. The camera module according to claim 1, wherein the heater comprises:
   an electrode formed on the terminal and the connecting portion.

3. The camera module according to claim 2, wherein the heating unit comprises:
   a through-hole allowing an upper portion of the lens to be mounted therein;
   a heating plate having the through-hole formed therein and connected with the electrode, the heating plate being heated by power supplied thereto; and
   a coating layer having an edge portion attached to the heating plate and a central portion attached to a surface of the lens, the coating layer being heated by power supplied thereto.

4. The camera module according to claim 3, wherein the electrode comprises:
   two conductive wires separated from each other and provided to the terminal and the connecting portion, the two conductive wires being electrically connected to the heating plate.

5. The camera module according to claim 4, wherein the printed circuit board comprises:
   a connector electrically connecting the terminal and the printed circuit board.

6. The camera module according to claim 5, wherein the connector comprises a pair of connectors, the pair of connectors being electrically connected to the two conductive wires.

7. A camera module comprising:
   a lens barrel having a hollow formed therein, the lens barrel being provided with at least one lens aligned in the hollow along an optical axis;
   a holder having an inner space formed therein and configured to accommodate a part of the lens barrel in the inner space;
   a casing having an inner space formed therein and configured to accommodate a printed circuit board in the inner space, the casing being coupled with the holder; and
   a heater electrically connected to the printed circuit board, a part of the heater being physically disposed between an outer circumferential surface of the lens barrel and an inner circumferential surface of the holder to heat the lens barrel and the lens, the heater including:
   a heating unit disposed to surround the outer circumferential surface of the lens barrel to heat the lens barrel and the lens;
   a terminal electrically connected to the printed circuit board to receive power from the printed circuit board;
   a connecting portion connecting the heating unit and the terminal; and
   an electrode formed on the terminal and the connecting portion.

8. The camera module according to claim 7, wherein the heating unit comprises:
   a heating plate connected to the electrode and heated by power supplied thereto.

9. The camera module according to claim 8, wherein the electrode comprises:
   two conductive wires separated from each other and provided to the terminal and the connecting portion, the two conductive wires being electrically connected to the heating plate.

10. A lens barrel comprising:
    a housing having an opening;
    at least one lens disposed in the housing, the at least one lens having an upper surface and a lower surface opposite the upper surface, a portion of the upper surface of the at least one lens extending through the opening;
    a conductive heating member directly contacting the upper surface of the at least one lens and being physically located between the housing and the upper surface of the at least one lens; and
    a power supply configured to apply power to the conductive heating member.

11. The lens barrel according to claim 10, wherein the at least one lens comprises a plurality of lenses,
    wherein the conductive heating member is disposed on an uppermost lens of the plurality of lenses.

12. The lens barrel according to claim 10, wherein the conductive heating member is transparent.

13. The lens barrel according to claim 10, wherein the conductive heating member comprises at least one of carbon nanotube (CNT) or graphene.

14. The lens barrel according to claim 10, wherein the conductive heating member is attached to the lens in a nano-mesh structure or a film form.

15. The lens barrel according to claim 10, wherein the conductive heating member has a thickness of 1 nm to 2 nm.

16. The lens barrel according to claim 10, wherein the power supply comprises:
- a power source;
- first and second electrodes disposed at an edge portion of the conductive heating member; and
- first and second wires connecting the power source to the first and second electrodes, respectively.

17. The lens barrel according to claim 16, wherein the housing comprises a non-conductive material,
the lens barrel further comprising:
- first and second connecting members corresponding to the first and second wires, respectively.

18. The lens barrel according to claim 16, wherein the housing comprises a conductive material,
the lens barrel further comprising:
- a third connecting member corresponding to the first wire.

19. A camera module comprising:
- a lens barrel having a hollow formed therein, the lens barrel being provided with at least one lens aligned in the hollow along an optical axis;
- a holder having an inner space formed therein and configured to accommodate a part of the lens barrel in the inner space;
- an electrical insulation layer located between the lens barrel and the holder;
- a casing having an inner space formed therein and configured to accommodate a printed circuit board in the inner space, the casing being coupled with the holder; and
- a heater electrically connected to the printed circuit board and configured to heat the lens,
wherein the lens barrel and the holder are configured to electrically connect the heater to the printed circuit board.

* * * * *